United States Patent
Lin

[19]

[11] Patent Number: 5,982,620
[45] Date of Patent: Nov. 9, 1999

[54] CPU CASING STRUCTURE WITH IMPROVED HEAT DISSIPATOR ANCHORING CONFIGURATION

[75] Inventor: Yu-Chen Lin, Taipei Hsien, Taiwan

[73] Assignee: Asia Vital Components Co., Ltd., Taipei Hsien, Taiwan

[21] Appl. No.: 09/087,976

[22] Filed: Jun. 1, 1998

[51] Int. Cl.[6] ...................................................... H05K 7/20
[52] U.S. Cl. ......................... 361/704; 174/16.3; 257/727; 361/719
[58] Field of Search ................................. 248/316.7, 510; 267/150, 158, 160; 24/453, 457, 458, 470, 473, 625, 295, 535, 573.1, 598.1; 174/16.3; 165/80.3, 185; 257/713, 714, 718, 719, 722, 727; 361/687, 695, 697, 704, 707, 722, 709–712, 717–719, 752, 756

[56] References Cited

U.S. PATENT DOCUMENTS

| | | |
|---|---|---|
| 5,660,562 | 8/1997 | Lin . |
| 5,684,676 | 11/1997 | Lin . |
| 5,791,403 | 8/1998 | Chiou . |
| 5,804,875 | 9/1998 | Remsburg . |
| 5,812,376 | 9/1998 | Mach . |
| 5,835,347 | 11/1998 | Chu . |

*Primary Examiner*—Gerald Tolin
*Attorney, Agent, or Firm*—Browdy and Neimark

[57] ABSTRACT

A CPU casing structure includes a casing body having a rear wall on which a side wall is mounted to define an open front side for receiving a nonpackaged a CPU therein. A heat dissipator having a base positionable over and in physical contact engagement with the CPU to provide heat transfer therebetween is releasably secured to the front opening of the casing body by means of at least one clip so as to substantially cover the front opening and thus house the circuit board and the CPU therein. The casing body has at least one clip anchoring members formed on the top edge thereof. The clip have a central section selectively postionable on the base of the heat dissipator and a fixed, but preferably resilient, end extension extending through holes formed on the casing body, the circuit board and the heat dissipator. The end extension has a bending on the free end thereof and the bending is formed as an acute angle to be received within a sloped cavity having an inclination of substantially the same angle formed on the casing body. The clips also have a movable extension defined by a hinged tab having a slot engageable with the respective anchoring member to secure the clips and thus fix the heat dissipator to the casing body together.

2 Claims, 3 Drawing Sheets

CPU CASING STRUCTURE WITH IMPROVED HEAT DISSIPATOR ANCHORING CONFIGURATION

FIELD OF THE INVENTION

The present invention relates generally to a CPU (central processing unit) casing structure and in particular to an improved anchoring configuration for more securely mounting a heat dissipator clip to a non-packaged CPU for securing the heat dissipator to the casing.

BACKGROUND OF THE INVENTION

The development of electronic technique brings computer CPUs into a high density and high speed era. With the fast increase of processing speed of the computer CPU, the amount of heat generated during the operation of the CPU fast increases to such an extent that without an additional heat dissipating device, which will be referred to as "heat dissipator", the CPU may readily malfunction due to the significant temperature rise caused by the heat generated during its operation.

One of the most prevailing CPUs nowadays is the so called "Pentium II" available from Intel Co. which comprises a CPU chip and an external cache both mounted on a circuit board and encased in a PLGA (Plastic Land-Grid Array) packaging. The formation of the PLGA packaging is time consuming and complicated so that such a packaging significantly increases the overall cost of the CPU. The packaged CPU is usually mounted to for example a computer main board by being inserted between two spaced members on the computer main board and engaged thereby so as to be fixed on the computer main board.

To overcome the cost problem and to increase market competitivity, a non-packaged version of the CPU is also available which has no PLGA package so that the manufacturing time and the cost are both cut down. However, to be compatible with the CPU support members on the computer main board that are designed to accommodate the packaged CPU, a casing has an outer configuration compatible with the CPU support members of the computer main board is needed to contain and protect the non-packaged CPU.

In the co-pending U.S. patent application Ser. No. 09/064, 315, which is filed on Apr. 23, 1998 and assigned to the assignee, a CPU casing structure for receiving and protecting the non-packaged CPU is disclosed which comprises at least one external anchoring member to allow a heat dissipator to be readily secured thereto by means of at least one clip engageable with the anchoring member for removing heat generated by the non-packaged CPU. The clip comprises a central section with a moveable extension on a first end and a fixed extension on a second end, both being in a direction substantially normal to the central section. The first extension comprises a hinged tab having a hole or slot thereon to engage the anchoring member on the casing. The second extension has a paw which extends through holes formed on the heat dissipator and the CPU casing to engage an outer surface of the CPU casing so as to secure the heat dissipator to the casing.

The paw on the fixed extension is formed by simply bending the free end of the extension to be substantially right-angled for overlapping and thus being supported by the outer surface of the casing. This, however, causes a problem that the engagement between the paw and the casing is achieved only by overlapping the right-angled bending on the outer surface of the casing which is not firm in fixing the paw to the casing. Thus, it needs an improved configuration for more firmly securing the clip to the CPU casing to mount the heat dissipator to the casing.

SUMMARY OF THE INVENTION

Therefor, an object of the present invention is to provide a CPU casing structure particularly for encasing a non-packaged CPU with a CPU heat dissipator secured thereto by means of at least one clip, wherein the clip has an perpendicular extension with an inclined end bending to be received within a sloped cavity on the CPU casing for more firmly securing the heat dissipator to the CPU casing.

To achieve the above objects, in accordance with the present invention, there is provided a CPU casing structure comprising a casing body having a rear wall on which a side wall is mounted to define an open front side for receiving a non-packaged a CPU therein. A heat dissipator having a base positionable over and in physical contact engagement with the CPU to provide heat transfer therebetween is releasably secured to the front opening of the casing body by means of at least one clip so as to substantially cover the front opening and thus house the circuit board and the CPU therein. The casing body has at least one clip anchoring members formed on the top edge thereof. The clip have a central section selectively postionable on the base of the heat dissipator and a fixed, but resilient, end extension extending through holes formed on the casing body, the circuit board and the heat dissipator. The end extension has a bending on the free end thereof and the bending is formed as an acute angle to be received within a sloped cavity having an inclination of substantially the same angle formed on the casing body. The clips also have a movable extension defined by a hinged tab having a slot engageable with the respective anchoring member to secure the clips and thus fix the heat dissipator to the casing body together.

BRIEF DESCRIPTION OF THE DRAWINGS

The present invention will be better understood from the following description of a preferred embodiment thereof, with reference to the attached drawings, wherein.

DETAILED DESCRIPTION OF PREFERRED EMBODIMENT

Figure 1:
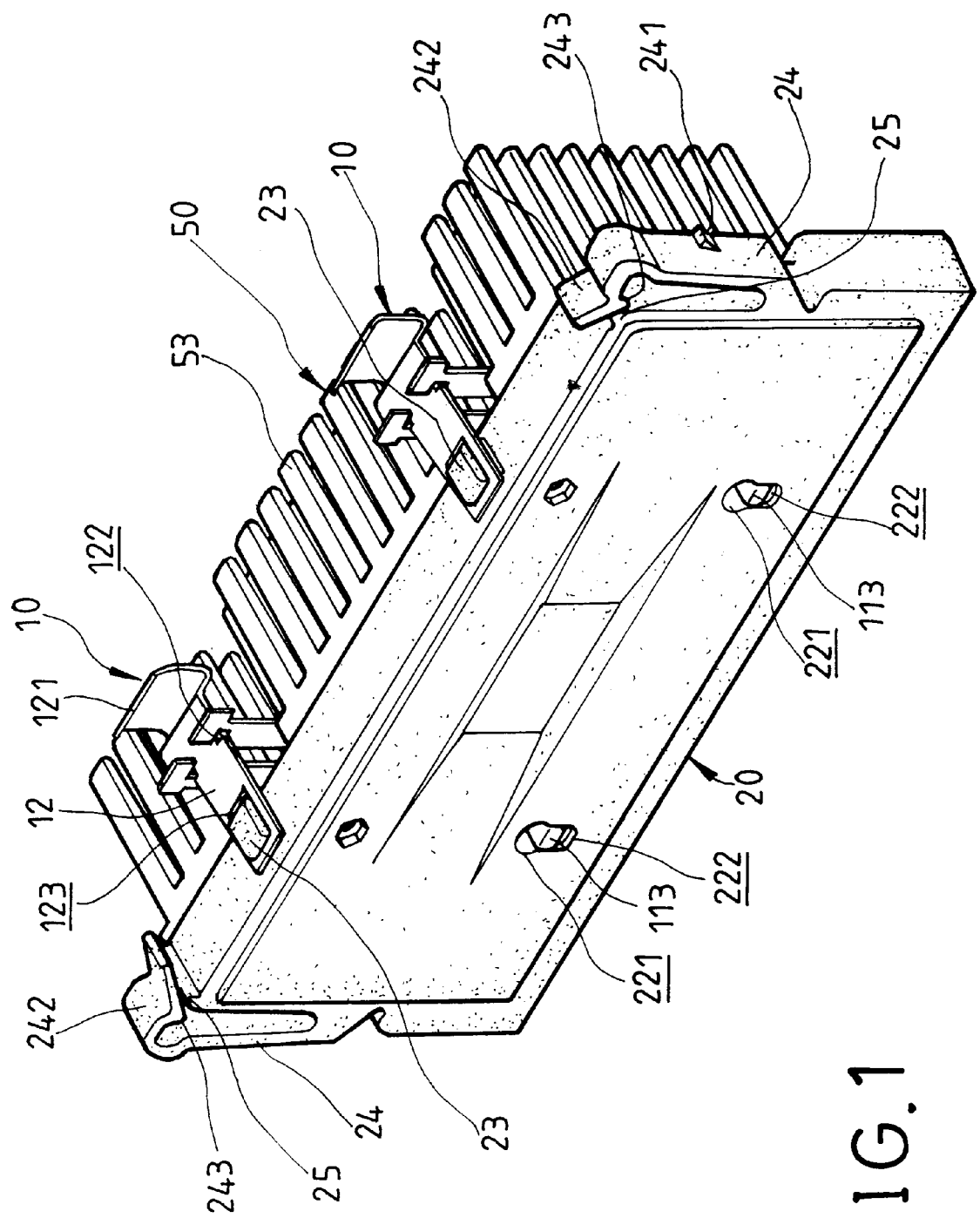
FIG. 1 is an exploded perspective view showing a CPU casing constructed in accordance with the present invention with a non-packaged CPU housed therein.
Figure 3:
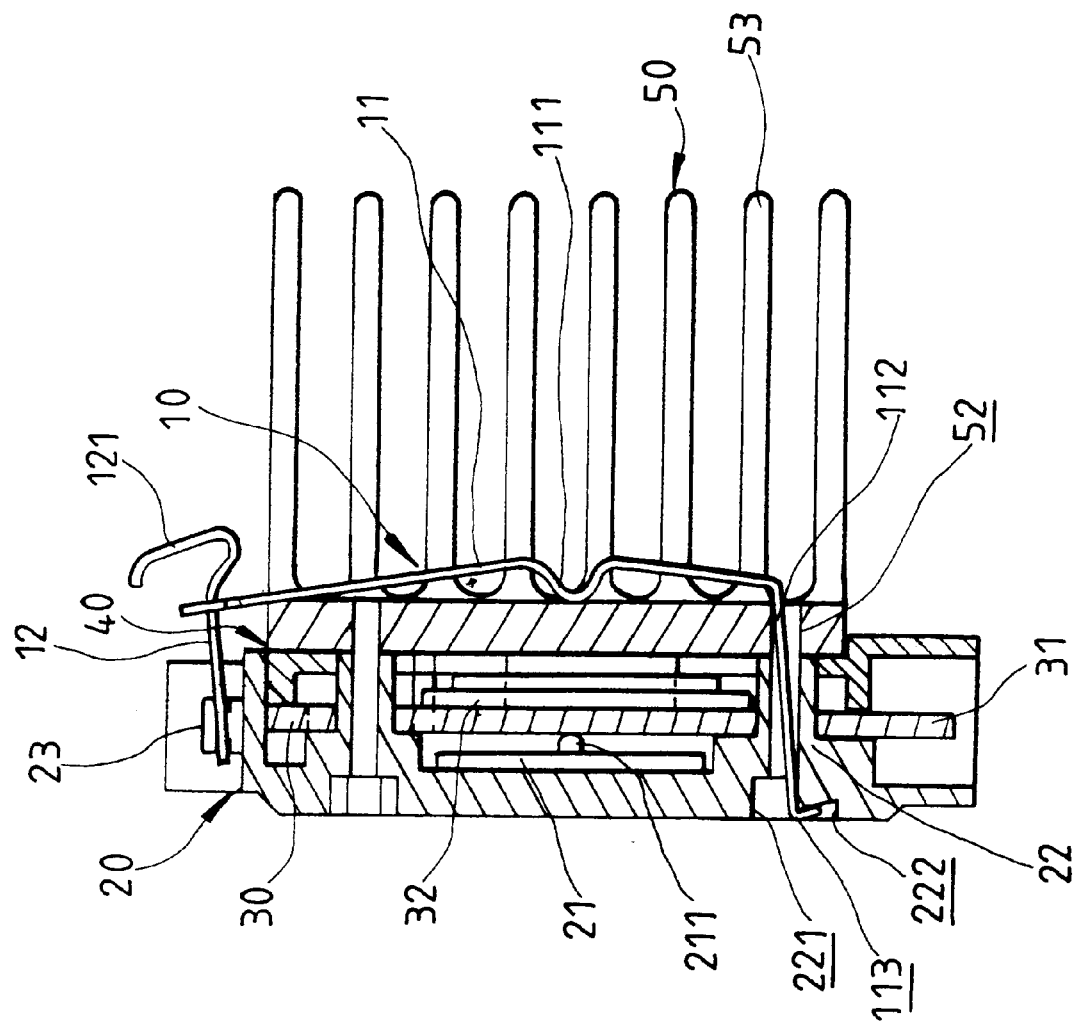
FIG. 3 is a cross-sectional view of the CPU casing of the present invention with the non-packaged CPU housed therein.

With reference to the drawings and in particular to FIGS. 1 and 3, wherein a CPU casing constructed in accordance with the present invention is shown, the CPU casing of the present invention comprises a casing body 20 having a rear wall to which a side wall comprising at least one top section and two lateral sections is fixed to define an interior space of the casing body 20 with an open front side for the entry and reception of a circuit board 30 having a CPU 32 (see FIG. 3) thereon into the casing body 20. The CPU casing of the present invention flier comprises a heat dissipator 50 sized to close the front opening of the casing body 20 so as to substantially house the circuit board 30 and the CPU 32 inside the CPU casing of the present invention with the heat dissipator 50 in physical contact with the CPU 32 for heat removal purpose (see FIG. 3).

The rear wall of the casing body 20 is provided with positioning pins 22 to be received within positioning holes 33 formed on the circuit board 30 for properly positioning the circuit board 30 inside the casing body 20.

The rear wall of the casing body 20 is also provided with at least one bore 221 extending therethrough. In the embodiment illustrated, the casing body 20 has two such bores 221 which are formed to extend through two of the positioning pins 22, but may not need to be so. The purpose of the bores 221 will be fuirther described.

Preferably, the casing body 20 is provided with a raised portion 21 (see FIG. 3) on the rear wall thereof to serve as a reinforcement for the casing body 20 for increasing the mechanical strength thereof.

Preferably, a support peg 211 is formed on the rear wall of the casing body 20, having a free end on which the circuit board 30 is positionable to be supported thereby. Preferably, the support peg 211 is located corresponding to the CPU 32 to support the CPU 32 in tight contact engagement with the heat dissipator 50. In the embodiment illustrated, the support peg 211 is formed on and extending from the raised portion 21 of the rear wall of the casing body 20.

The casing body 20 is provided with a resilient arm 24 on each of the opposite lateral sections of the side wall thereof. Each of the resilient arms 24 has a fixed end fixed to the side wall and runs substantially parallel with, but spaced from the lateral section of the side wall so as to allow a free end of the resilient arm 24 to be movable with respect to the side wall by means of elastic deformation thereof. A manual operating tab 242 is formed on the free end of each of the arms 24 so as to allow a user to forcibly deform the arm 24 for moving the free end thereof relative to the side wall. An arm securing member, in the form of a raised rib 243 on the underside of a bent section of the manual operating tab 242, is provided which is engageable with a corresponding raised portion 25 on the side wall of the casing body 20 by being forced to slide thereover.

The casing body 20 is sized corresponding to the spacing between the two support members on the computer main board (not shown) to which the CPU 32 is to be connected so as to be receivable within the spacing between the support members. Each of the resilient arms 24 is provided with a barb 241 which is engageable with an opening formed on the associated support member so as to secure the casing body 20 to the computer main board.

The provision of and the engagement between the raised ribs 243 of the resilient arms 24 and the raised portions 25 on the side wall of the casing body 20 allows the resilient arms 24 to be temporarily held close to the side wall and thus facilitate the disposition of the casing body 20 into the spacing between the support members of the computer main board. By releasing the resilient arms 24 from the side wall, the barbs 241 of the resilient arms 24 engage the openings of the support members and thus securing the casing body 20 to the computer main board.

The CPU casing structure of the present invention also comprises heat dissipator securing means, including at least one clip 10 (preferably two as shown in the drawings) which secures the heat dissipator 50 to the casing body 20 to be in contact with the CPU 32. Clip anchoring means is provided to fix the clips 10 to the casing body 20, comprising an anchoring block 23 corresponding to each of the clips 10 and disposed opposite to the bores 221 of the casing body 20. In the embodiment illustrated, the anchoring blocks 23 are provided on the top section of the side wall or the top edge of the rear wall, while the bores 221 are located close to the bottom edge of the rear wall of the casing body 20. In the embodiment illustrated, there are two such anchoring blocks 23 corresponding to the two clips 10 and the anchoring blocks 23 are mounted to and spaced along the top section of the side wall of the casing body 20. Preferably, each of the anchoring blocks 23 has a groove 231 (see FIG. 2) formed thereon.

Each of the clips 10, which is made resilient, has a central section 11 having an end on which a fixed but preferably resilient extension 112 extending therefrom in a direction substantially perpendicular thereto. The fixed extension 112 has a free end on which a bending 113 is formed. The bending 113 is formed in such a way to define an acute angle with the fixed extension 112 as particularly shown in FIG. 3.

On another end of the central section 11 of the clip 10, a movable extension which is also substantially perpendicular to the central section 11 is provided, comprising a plate or tab 12 hinged to the end of the central section 11 of the clip 10. The movable plate 12 is provided with a manual operating tab 121 with which a user manually rotates the movable plate 12 with respect to the central section 11 of the clip 10 about the hinge connection 122.

The movable plate 12 of the clip 10 is provided with a hole or slot 123 which is engageable with the groove 231 of the respective anchoring block 23 for securing the end of the clip 10 to the anchoring block 23.

Preferably, the central section 11 of the clip 10 is provided with a recess 111 for abutting against the flat base of the heat dissipator 50 to provide an increased resiliency of the clip 10.

Figure 2:
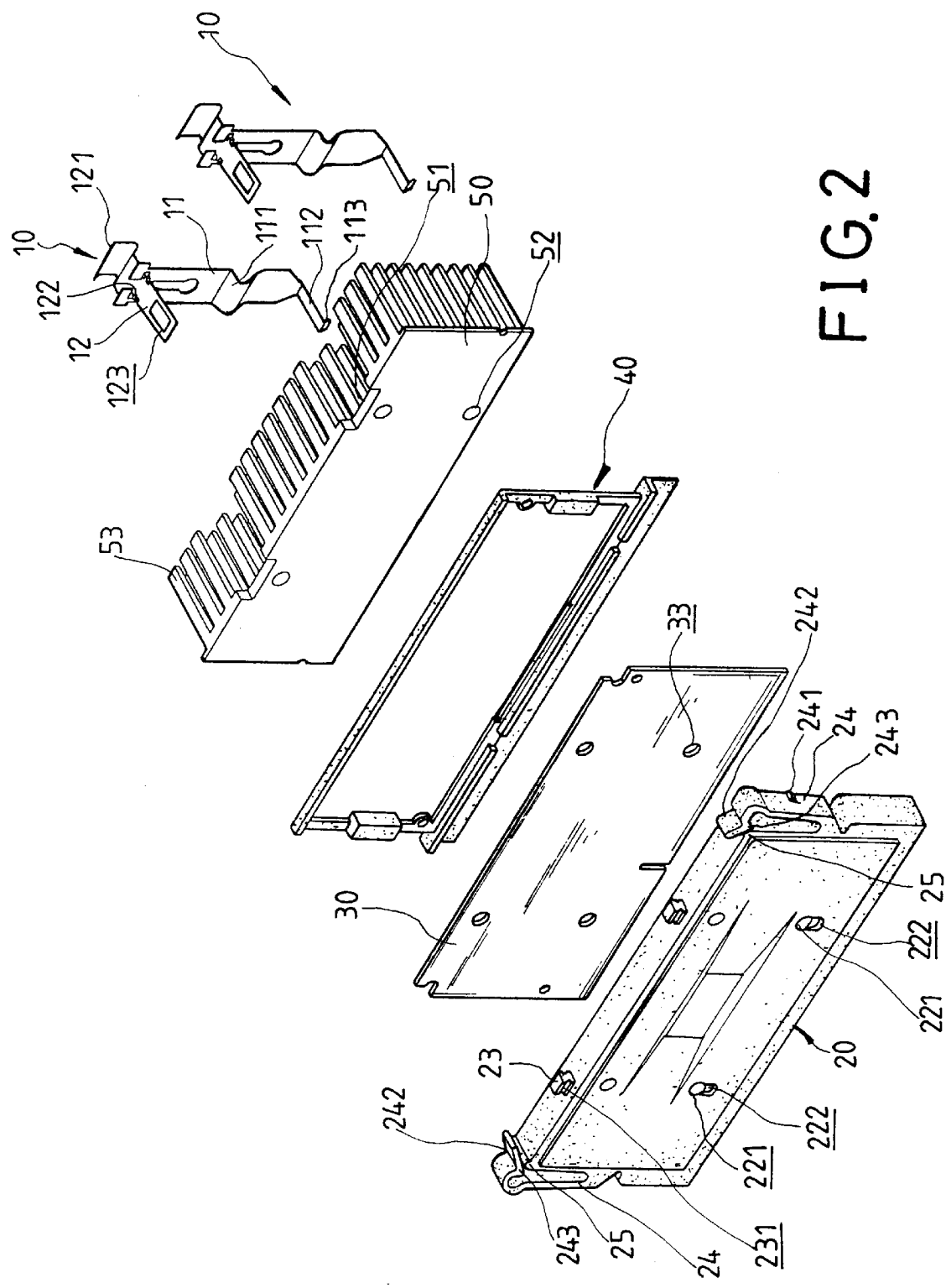
FIG. 2 is a perspective view of the CPU casing of the present invention.

Each of the bores 221 is provided with an sloped cavity or slot 222, particularly shown in FIG. 3, having an inclination corresponding to the angle of the bending 113 of the fixed extension 112 of the clip 10 for receiving and providing a firmer engagement between the fixed extension 112 of the clip 10 and the casing body 20, see FIGS. 2 and 3, by first having the fixed extension 112 extending through the respective bore 221.

In mounting the heat dissipator 50 to the casing body 20 to be in contact with the CPU 32 that is received within the casing body 20, in accordance with the present invention, the heat dissipator 50 is provided with non-fined sections 51 among the fins 53 for accommodating the central sections 11 of the clips 10 therein. The fixed extension 112 of each of the clips 10 is first inserted sequentially through a hole 52 formed on the heat dissipator 50 and the hole 33 on the circuit board 30 and the bore 221 on the casing body 20 to have the acute bending thereof 113 engaging the sloped cavity 222 formed on the casing body 20 and at this moment, the recess 111 of the central section 11 rests on and abuts against the heat dissipator 50.

By means of the resiliency of the clip 10, the movable plate 12 is manually forcible toward the respective anchoring block 23 on the casing body 20. By forcibly deforming the movable plate 12 toward the respective anchoring block 23 and rotating the movable plate 12 with respect to the central section 11 of the clip 10, the slot 123 of the movable plate 12 is allowed to pass over the anchoring block 23. Under this situation, by rotating the movable plate 12 back to the original position, the slot 123 is brought into engagement with the groove 231 of the anchoring block 23 and thus fixing the clip 10 to the casing body 20 which secures the heat dissipator 50 to the casing body 20 with the circuit board 30 interposed between the heat dissipator 50 and the support peg 211 of the casing body 20 and the heat dissipator 50 in physical engagement with the CPU 32 on the circuit board 30.

The provision of the recess 111 on the central section 11 of the clip 10 enhances the resiliency and elastic deformability of the clip 10 so as to provide a better effect of securing the heat dissipator 50 and the circuit board 30 to the casing body 20.

It should be noted that as mentioned above, the bores 221 are arranged to be opposite to the anchoring blocks 23 so that a firm securing of the heat dissipator 50 to the casing body 20 may be obtained by having the two ends of the clip 10 fixed to the anchoring block 23 and the sloped cavity 222 of the casing body 20. The inclination of the sloped cavity 222 and the acute angle of the bending 113 of the fixed extension 112 of the clip 10 provides a firmer engagement therebetween so as to be more effective in preventing the fixed extension 112 of the clip 10 from disengaging from the casing body 20.

The interposition of the circuit board 30 between the casing body 20 and the heat dissipator 50 makes the circuit board 30 securely fixed. However, to have the circuit board 30 even more securely held, it is preferable to provide a circuit board fixing frame 40 having a configuration substantially corresponding to the shape of the circuit board 30 and an effective thickness corresponding to that of the CPU 32 so that by interposing the frame 40 between heat dissipator 50 and the circuit board 30, when the heat dissipator 50 is secured to the casing body 20 by means of the clips 10, the circuit board 30 may be more securely held by the heat dissipator 50 via the circuit board fixing frame 40.

Quite obviously, the moveable extension of the clip 10 may be replaced by a fixed extension that has a greater resiliency so as to allow the extension to be moved with respect to the central section of the clip with the connection between the extension and the central section serving as a "hinge".

Although the preferred embodiment has been described to illustrate the present invention, it is apparent that changes and modifications in the specifically described embodiment can be carried out without departing from the scope of the invention which is intended to be limited only by the appended claims.

What is claimed is:

1. A CPU casing structure comprising a casing body having an interior space with an open front side adapted to receive a circuit board that includes a CPU inside the casing body, and a heat dissipator comprising a flat base adapted to be positioned over and thus in physical contact engagement with the CPU to provide heat transfer therebetween, securing means being provided to releasably secure the heat dissipator to the front opening of the casing body so as to substantially cover the front opening and thus house the circuit board and the CPU in casing body, the securing means comprising at least one clip having a central section with a first extension provided on a first end of the central section and a second extension on a second end of the central section, the central section being adapted to be positioned on the heat dissipator to have the two extensions thereof engaging the casing body so as to secure the heat dissipator to the casing body, the improvements comprising an acute bending formed on a free end of at least one of the extensions of the clip and a sloped cavity formed on the casing body positioned and sized to receive the bending therein, the sloped cavity having an inclination corresponding to the acute angle of the bending so as to provide a firm engagement therebetween.

2. The CPU casing structure as claimed in claim 1, wherein the CPU casing structure comprises two clips to secure the heat dissipator to the casing body.

* * * * *